United States Patent [19]
Chakradhar et al.

[11] Patent Number: 5,657,240
[45] Date of Patent: Aug. 12, 1997

[54] TESTING AND REMOVAL OF REDUNDANCIES IN VLSI CIRCUITS WITH NON-BOOLEAN PRIMITIVES

[75] Inventors: Srimat T. Chakradhar, North Brunswick, N.J.; Steven G. Rothweiler, Kunkletown, Pa.; Vishwani D. Agrawal, Murray Hill, N.J.

[73] Assignee: NEC USA, Inc., Princeton, N.J.

[21] Appl. No.: 431,599

[22] Filed: May 1, 1995

[51] Int. Cl.$^6$ ................................................. G06F 17/50
[52] U.S. Cl. ..................... 364/488; 364/489; 364/578; 371/27.1
[58] Field of Search .................. 364/488, 489, 364/578; 371/27

[56] References Cited

U.S. PATENT DOCUMENTS

| | | | |
|---|---|---|---|
| 5,448,497 | 9/1995 | Ashar et al. | 364/488 |
| 5,498,943 | 3/1996 | Kimoto et al. | 364/151 |
| 5,524,082 | 6/1996 | Harstmann et al. | 364/489 |

OTHER PUBLICATIONS

Tromp et al., "Logic Synthesis of 100% Testable Logic Networks," 1991–Int'l Conf. Comp. Des. –ICCD '91, pp. 428–431.

Moulin, "A Multiscale Relaxation Algorithm for SNR Maximization in Nonorthogonal Subband Coding", IEEE Trans on Image Proc. pp. 1269–1281.

Cheng et al., "Multi–Level Logic Optimization by Redundancy Addition & Removal", Euro Des. Auto. Conf, Feb. 1993, pp. 373–377.

Wu et al., "Multiple Redundancy Removal During Test Generation & Symthesis", VLSI Test Symp., IEEE 1992, pp. 274–279.

Yotsuyanagi et al., "Synthesis for Testability by Sequential Redundancy Removal Using Retiming", 1995 Int'l Symp. Fault–Tol. Comp., pp. 33–40.

Kajihara et al., "Removal of Redundancy in Logic Circuits under Classification of Undetectable Faults", Fault–Tol. Comp., Symp. 1992, pp. 263–279.

J.Th. van der Linden et al, "Test Generation and Three–State Elements, Busses, and Bidirectionals" in IEEE VLSI Test Symposium, Apr. 1994, pp. 114–121.

T. Larrabee, "Test Pattern Generation Using Boolean Satisfiability," in IEEE Trans. On Computer–Aided Design, vol. 11, Jan. 1992, pp. 4–15.

T. Stanion et al, "TSUNAMI: A Path Oriented Scheme for Algebraic Test Generation," in Proc. of the 21st IEEE Inter. Symp. on Fault Tolerant Computing, Jun. 1991, pp. 36–43.

C.L.C. Cooper et al, "Neural Models for Transistor and Mixed–Level test Generation", in Proc. of 12th VLSI Test Symposium, April 1994, pp. 208–213.

P.R. Menon et al, "Redunancy Removal and Simplification of Combinational Circuits," in Proc. of IEEE VLSI Test Symposium 1992, pp. 268–273.

M. Abramovici et al, "One–Pass Redundancy Identification and Removal, " in Proc.1 of IEEE International Test Conference, Sep. 1992, pp. 807–815.

*Primary Examiner*—Kevin J. Teska
*Assistant Examiner*—Tyrone V. Walker
*Attorney, Agent, or Firm*—Arthur J. Torsiglieri

[57] ABSTRACT

Techniques for the generation of tests for detecting specified faults in circuits that include non-Boolean components and for identifying these undetectable faults that are logically redundant. The main features are: (1) only one Boolean variable is used to represent the value on a signal and all signals assume only Boolean values during the test generation procedure, (2) function of non-Boolean components is separated into Boolean and non-Boolean states, and energy functions are derived only for the Boolean state, and (3) non-Boolean states are implicitly considered in the energy minimization procedure.

2 Claims, 4 Drawing Sheets

FIG. 1
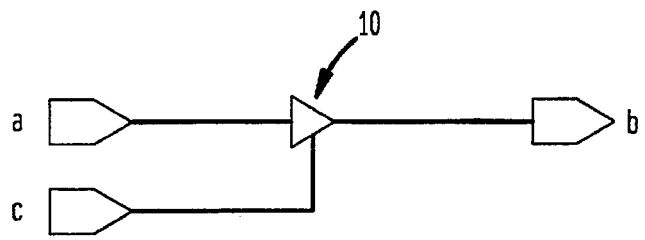
FIG. 2
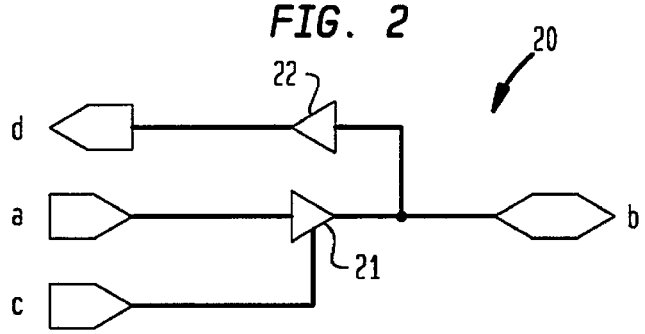
FIG. 3
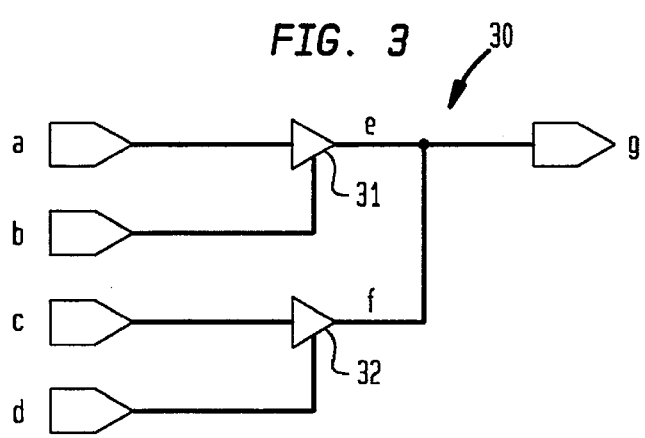
FIG. 4
| a | c | b |
|---|---|---|
| 0 | 1 | 0 |
| 1 | 1 | 1 |
| X | 0 | Z |

TESTING AND REMOVAL OF REDUNDANCIES IN VLSI CIRCUITS WITH NON-BOOLEAN PRIMITIVES

FIELD OF THE INVENTION

This invention relates to techniques for testing VLSI circuits that include components that are non-Boolean. Typical of such components are tri-state buffers, bidirectional or input/output buffers and bus configurations, each of which can assume non-Boolean values, such as high impedance states, in addition to the usual Boolean values, such as zeroes and ones. In particular, the invention seeks to identify redundancies in such circuits and when feasible, remove the redundancies to save on silicon area required to manufacture the circuit.

BACKGROUND OF THE INVENTION

An important role of testing VLSI circuit designs is to identify redundant faults in the design. A redundant fault is a fault that has no effect on the circuit behavior with respect to the output of the circuit, although its presence can add unnecessarily to the silicon area of the circuit or slow its performance. However, a redundant fault typically cannot be recognized a priori and the process of generating a test generally serves to identify such a fault. It is important to identify redundant faults in a design both to avoid the need for testing for them in the product of manufacture but also because their identification sometimes is useful to a redesign that will improve the cost performance of the circuit.

Many practical VLSI circuits typically include non-Boolean primitives like tri-state buffers, bidirectional buffers and bus configurations. Some test generation systems use logic models for non-Boolean gates. These models, though accurate, are very pessimistic and often fail to find tests. A realistic modeling of these primitives for test generation or logic simulation requires the use of Boolean logic values like 0 or 1 and additional non-Boolean logic values like the high-impedance state (Z). In the past, at least five values have been used for test generation: 0, 1, Z, U and X. The value X denotes a yet unspecified signal value and U denotes an unknown value. For example, if an OR gate has a value Z (or U) at one input and values 0 at all other inputs, then the output assumes the value U. Test generation for combinational circuits with non-Boolean primitives is significantly more complex than circuits with only Boolean primitives due to the additional non-Boolean values. For example, a recent paper by J. Van der Hinden et al entitled "Test Generation and Three-State Elements, Buses and Bidirectionals," in VLSI Test Symposium, pp. 114–121, April 1994, describes a 25-value logic system for generating tests for production circuits that include non-Boolean components. In this application, we refer to circuits which may include both Boolean and non-Boolean components generically as production circuits. The term combinational circuits is used for circuits that include only Boolean logic gates.

Methods using energy minimization, Boolean satisfiability (described in a paper by T. Larrabee entitled "Test Generation Using Boolean Satisfiability" in IEEE Trans. on Computer-Aided Design, vol. 11, pp. 4–15, January 1992) and Binary Decision Diagram (BDD-based) (described in a paper entitled by T. Stanion and D. Bhattacharya entitled "TSUNAMI: A Path Oriented Scheme for Algebraic Test Generation," in Proc. of the 21st IEEE Inter. Syrup. on Fault Tolerant Computing, pp. 36–43, June 1991) formulations have been recently proposed for generating tests for combinational circuits. The teachings of these prior art references are incorporated herein by reference. These methods are fast and practical for testing large combinational circuits and share the following similarities: (1) they represent logic values on signals by Boolean variables, (2) they construct energy functions or satisfiability expressions using these Boolean variables and (3) they solve the energy minimization or the satisfiability problem to obtain a set of Boolean values for the variables and this set corresponds to a test for the fault. An example of the energy minimization approach is described in U.S. Pat. No. 5,377,201 that issued on Dec. 27, 1994 and the teaching of this patent is incorporated herein by reference. Extending these formulations to production circuits is non-trivial for the following reasons: (1) signals can assume more than two values (for example, a tri-state buffer can assume the high-impedance state) and two or more Boolean variables are required to represent the additional logic values of a signal,(2) new and more complex energy functions and satisfiability expressions have to be designed for all Boolean and non-Boolean primitives in the circuit, and (3) the additional Boolean variables significantly increase the search space of the test generation problem, and this can render the new formulation expensive to test for large designs.

The present invention describes a systematic methodology for modifying combinational test generation algorithms for use with production circuits. We also describe the use of the proposed methodology for identifying and removing redundancies in production circuits.

SUMMARY OF THE INVENTION

The present invention involves first testing the VLSI circuit that includes both Boolean and non-Boolean components for a specified fault by considering Boolean and non-Boolean behavior of every non-Boolean component. If no test is found for the specified fault, then there exists the possibility that the fault is redundant. To test for this possibility, the circuit is tested with a novel relaxed test generation algorithm in which there is ignored the non-Boolean states of all non-Boolean components, so that there are fewer constraints on the values that the inputs and output of these components can assume. This mode of test generation will be described hereinafter as the relaxed test generation mode. If a specific fault remains undetectable in the relaxed test generation mode, that fault is in fact redundant. With the knowledge that the specific fault is in fact redundant, we can then proceed either to remove the fault if such removal is advantageous either to reduce chip area or to speed the circuit or, if not, to tolerate the fault with equanimity in the knowledge that the fault is harmless.

Additionally in the present application, we describe a methodology for extending standard test generation algorithms for combinational circuits to production circuits. Key features of the methodology are illustrated, for example, by converting the energy minimization-based test generation algorithm for combinational circuits described in the cited patent into a new algorithm for such production circuits. The main features of our methodology that make the new test generation algorithm practical for state of the art production circuits, such as those with more than 100,000 gates, are as follows: (1) only one Boolean variable is used to represent the value on a signal, (2) signals assume only Boolean values during the test generation procedure, (3) behavior of a non-Boolean component is separated for Boolean and non-Boolean states, and energy functions are derived only for the Boolean states, and (4) non-Boolean states are implicitly considered during the energy minimization procedure. A similar technique can be used to extend the prior art Boolean satisfiability and BDD-based formulations for generating tests for production circuits discussed in the two aforementioned papers that were incorporated by reference.

Note that unlike combinational circuits, not all undetectable faults in production circuits are redundant. Although no extension of Boolean satisfiability or BDD-based formulations for production circuits have been reported, it is likely that any extension will also be unable to separate undetectable faults into redundant and untestable faults.

In this application we further describe a method of identifying and so make feasible removing redundancies in production circuits using these new formulations. In particular, if a target fault is undetectable by using the proposed test generation technique, then a new energy minimization problem is formulated by relaxing specific constraints. We refer to the new problem formulation as relaxed test generation formulation. We show that undetectability in the relaxed test generation formulation implies redundancy. We then can simplify the logic in the circuit by eliminating the redundant fault. Experimental results on several production VLSI circuits demonstrate the effectiveness of our redundancy removal algorithm.

BRIEF DESCRIPTION OF THE DRAWING

The invention will be understood from the following more detailed description taken with the accompanying drawing in which:

FIGS. 1, 2 and 3 are logic diagrams of a tri-state buffer, a bidirectional buffer and a bus configuration, respectively. These represent the most important forms of non-Boolean components whose presence in production circuits tends to cause the problems the present invention aims to ameliorate.

FIG. 4 is the truth table of the tri-state buffer shown in FIG. 1.

DETAILED DESCRIPTION OF THE INVENTION

Figure 5:
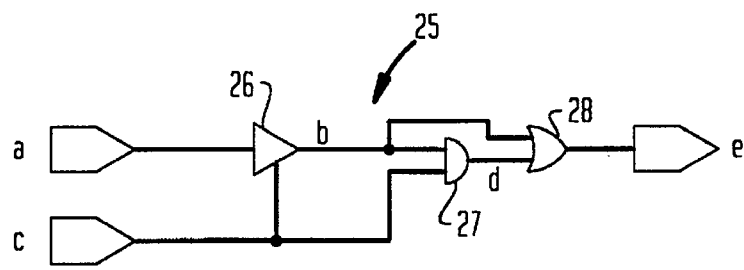
FIG. 5 is an example of a circit including a tri-state buffer that is to be tested for a particular fault.

Before discussing the invention, it will be helpful to provide more background material.

Commerical circuits typically contain some form of tri-state buffers, I/O bidirectional buffers or bus configurations. The logic diagrams for tri-state and bidirectional primitives are shown in FIGS. 1 and 2, respectively. The tri-state buffer 10 shown in FIG. 1 has two inputs, information signal a and control signal c, and one output signal b. Its truth table is shown in FIG. 4. Signals a and b assume identical values whenever the control signal c has the value 1. If c=0, then in the test generation model the value on signal input a is considered irrelevant (indicated as X) because it does not affect the output signal b. Also, output b will be in the high impedance state (indicated as Z).

The bidirectional buffer 20 seen in FIG. 2 consists of a tri-state buffer 21 and a non-inverting buffer 22. It has two input signals a and c, and two output signals b and d. The two output signals always have identical logic values. Whenever control signal c=1, the output signals assume the value of signal a. However, when control signal c=0, the value on signal input a is irrelevant and output b assumes the high-impedance state. Thus, signal b can be driven to any logic value applied to it by an external source and signal d will assume the same value as that of b.

The logic diagram for a bus configuration 30 is shown in FIG. 3. Here, two tri-state buffers 31, 32 are driving the bus g. In general, any plural number of tri-state buffers can drive the same bus. If all tri-state buffers are in the high-impedance state, then the bus assumes the high-impedance state. If more than one tri-state buffer tries to drive the bus to different Boolean logic values (0 and 1), the value on the bus is undefined (U). Otherwise, one or more tri-state buffers can drive the bus to a unique Boolean value while others remain in the high-impedance state.

A feature of the invention is the separation of the behavior of a non-Boolean component into Boolean and non-Boolean relationships or states. The Boolean state describes input conditions for which the output assumes a Boolean value. Other behavior is called the non-Boolean state. Energy functions for use in energy minimization procedures are constructed to capture the Boolean state. As explained later, the non-Boolean state condition is explicitly satisfied during the energy minimization procedure. Only those sets of signal values that also satisfy the non-Boolean state are considered during energy minimization.

We will illustrate the modeling of tri-state buffers and bus configurations. Bidirectional buffers or other non-Boolean components can be modeled similarly. Our modeling technique can also be used to extend the Boolean satisfiability or BDD-based formulations for production circuits mentioned earlier.

Consider the tri-state buffer shown in FIG. 1. The Boolean state is described as follows: if c=1, then signals a and b assume identical values. The non-Boolean state of the tri-state buffer specifies that signal b assumes the high-impedance state whenever signal c is 0. The Boolean state in the tri-state buffer is easily represented as the following arithmetic energy function: $F_{ST3}=c a \bar{b}+\bar{c} a b=0$. Note that this energy function minimization equation is satisfied by values of a, b and c that do not correspond to the complete functional behavior of the tri-state buffer. For example, $F_{ST3}$ assumes the value 0 for the set of values c=0, a=0 or 1, and b=0 or 1. This is not surprising since the complete behavior of the tri-state buffer is not captured in the energy function. These are the only sets of values that minimize $F_{ST3}$ but they do not correspond to the functional behavior of the tri-state buffer. A careful examination will show that the present model is quite different from the four binary signal model, described in a paper in Proc. of 12th VLSI Test Symposium, April 1994, pp. 208–213, entitled "Neural Models for Transistor and Mixed-Level Test Generation."

The advantages of our model will become evident as we discuss its applications. As explained later, the energy minimization procedure explicitly avoids such sets of values. A similar approach is followed for bidirectional buffers.

The energy function for a bus configuration can be derived similarly. Consider the bus configuration shown in FIG. 3. Two tri-state buffers 31, 32 are driving the bus g. Similar to the case of the tri-state buffer, we separate the behavior into Boolean and non-Boolean states. Consider the tri-state buffer 31 (32). If its control line b (d) is 1, then signal a (c) and the bus assume identical logic values. This constitutes the Boolean state and the energy minimization can be represented as the following arithmetic energy function:

$$F_{BUS}=d(c\bar{g}+\bar{c}g)+b(a\bar{g}=\bar{a}g)=0 \quad (1)$$

Note that the function $F_{BUS}$ assumes the value 0 whenever b and d are both 0. This means that when b and d are both 0, g can assume any logic value 0 or 1. However, this combination of values is not consistent with the non-Boolean state of the behavior of the gate because signal g should assume the high-impedance state when b=d=0. Thus, the energy minimization procedure explicitly ensures that the non-Boolean state of the behavior is satisfied during the minimization phase (as will be described below). The non-Boolean state describes the case when no tri-state buffer drives the bus, which goes to the high-impedance state. Bus conflicts are implicitly considered by the energy function $F_{BUS}$. For example, if b=d=1 and signals a and c assume different Boolean values, then there is a bus conflict. It can be easily verified that $F_{BUS}$ assumes a non-zero value whenever a bus conflict occurs. It is worth noting that the energy function $F_{BUS}$ does not use the Boolean variables e and f that are the outputs of the tri-state buffers. Therefore, these variables are not part of the energy minimization formulation and they will not be considered as decision variables.

Figure 9:
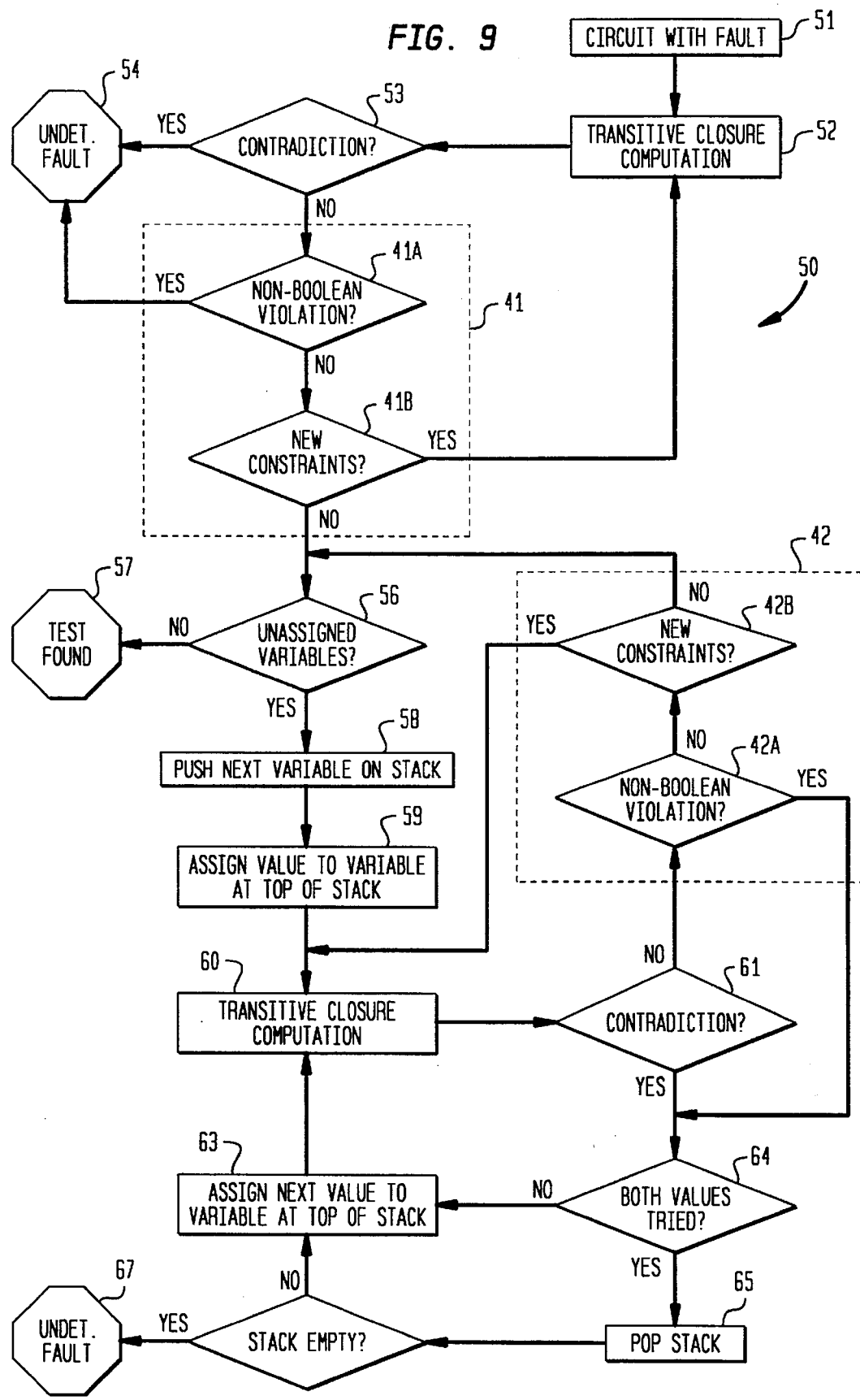
FIG. 9 is a test generation algorithm known for use with combinational circuits that has been modified according to the invention for use with production circuits.

FIG. 9 shows a flow chart 50 of an algorithm for seeking a test for detecting a specified fault in a production circuit that includes a non-Boolean component or primitive that is a modification of the algorithm for seeking a test for a specified fault in a pure combinational circuit that is described in the aforementioned patent.

This latter algorithm is a sequence of two main steps that are repeatedly executed: transitive closure computation and decision-making. The transitive closure computation phase determines additional signal values and relationships based on the current partial signal assignment. The decision-making part is implemented as a branch and bound algorithm. The complete algorithm for combinational circuits is described in the patent.

The corresponding test generation algorithm for production circuits is similar to the combinational circuit case with a few additions. In the flow chart of FIG. 9, the additions are enclosed in dotted line boxes 41 and 42.

Box 41 represents the step of checking for non-Boolean violation. We determine if the current partial signal assignment violates the behavior of any non-Boolean component. Such violation is possible since only the Boolean state is modeled by the energy function. If the behavior of a non-Boolean component is violated, then we backtrack. This involves undoing all signal assignments that were derived or additional constraints that were added since the last decision variable was selected. Addition of new constraints is discussed next.

If the current partial assignment is such that a Boolean value on a non-Boolean component is not implied by the current input values to the primitive, then certain mandatory assignments and relationships can be derived. For example, if the tri-state buffer of FIG. 1 assumes a value 1, but both a and c are still unassigned, then we can make the mandatory assignment a=c=1. Similarly, if the bus of FIG. 3 is assigned a Boolean value, then at least one of the control lines of the tri-state buffers driving the bus must be assigned the value 1. For this example, we include the constraint $\overline{bd}=0$ into the circuit energy function. If new values or relationships are derived, then we repeat the transitive closure computation phase to determine if the new constraints cause signal conflicts.

Unlike prior methods, the above procedure results in a test generation algorithm that has several advantages: (1) no modifications are necessary to the heuristics used by the combinational test generator, (2) no new energy functions or satisfiability models are needed for gates to account for non-Boolean values, (4) complex value systems are not used, and (3) only Boolean values are considered for any signal. Therefore, sophisticated encoding of 0, 1, Z, U and X values by several Boolean variables is unnecessary. The high-impedance state or additional logic values are never considered as alternatives during the decision-making phase. Therefore, the search space is identical for production and combinational circuits consisting of equal number of gates. The above modifications ensure that only those partial signal assignments that are consistent with the behavior of all non-Boolean primitives are extended to obtain a test.

FIG. 9 shows the flow chart 50 of the modified algorithm that has just been discussed. The boxes refer either to the various computer-implemented steps of the algorithm or the components of a special purpose computer. We begin with a circuit and a given target fault (box 51). We compute the transitive closure of the circuit (box 52) as described in the aforementioned Pat. No. 5,377,201. Box 53 checks if there is a contradiction. If any signal has to be assigned a value of 0 and 1 simultaneously, then a contradiction arises. In the case of a contradiction, we classify the fault as an undetectable fault (box 54).

The next step is to check if the signal assignments made thus far contradict with the non-Boolean part of the function of a non-Boolean component. This check is made in Box 41A. If the current signal assignment is not consistent with the function of the non-Boolean component, then we mark the fault as undetectable (box 54). Otherwise, we generate additional constraints on the non-Boolean primitives, based on the current signal assignment. This is done in box 41B.

We now enter the branch and bound phase of the test generation algorithm. During this phase, we systematically examine all combinations of values for the signals and identify a set of signal values that will serve as a test for the target fault. In box 56, we select a variable that has not yet been assigned a value. If there are no such variables, then the current assignment of logic values for the primary inputs of the circuit can serve as test.

After selecting a variable in box 56, we push the variable onto a stack (box 59). This stack is used to ensure that we do not look at any combination of signal values, twice. We then assign a logic value to the variable at the top of the stack (box 63). After the value assignment, we again compute the transitive closure of the circuit using techniques described in the aforementioned patent. If the transitive closure indicates a contradiction (box 61), then we examine to see, in box 64, if we have tried both logic values 0 or 1 for the variable on the top of the stack. Otherwise, we enter box 42A to verify if the current assignment violates the non-Boolean function of any non-Boolean component. Boxes 42A and 42B are identical to box 41A and 41B, respectively. If no new constraints are generated in box 42B, then we select a new decision variable in box 56. Otherwise, some new constraints have been generated and we re-compute the transitive closure of the circuit in Box 60.

If both values on a signal have been tried in Box 64, then we remove the variable for which we have considered both values, from the stack (box 65). If the stack has no variables, then the fault is undetectable (box 67) and we are done. Otherwise, we assign a new value to the variable that is now on the top of the stack. This is done in box 63.

As an example of the production circuit algorithm, consider the circuit 25 shown in FIG. 5. Circuit 25 comprises a tri-state buffer 26 with inputs a and c and output b. Output b is connected as one input to each of AND gate 27 and OR gate 28. Input c is the other input to AND gate 27. The output d of gate 27 is the other input of OR gate 28. Output e is the output terminal of OR gate 28. Suppose that a test is desired for a stuck-at 0 fault on output e. Initially, all signals are unassigned. Let d be the first decision variable and we select the value d=0. The transitive closure computation phase determines the following signal assignments: b=1, and c=0. Before we pick the next decision variable, we examine the tri-state buffer 26 and observe that the signal assignment c=0 and b=1 is inconsistent with the function of the tri-state buffer. Therefore, we backtrack to the previous decision variable d. We now assign d=1 and enter the transitive closure phase. During this phase, the following signal assignments are determined without any further search: a=b=c=1. After this phase, we again examine if the current signal assignment violates the behavior of any non-Boolean component. Since the behavior of the tri-state buffer is not violated, and there are no more decision variables, we terminate the decision-making phase. A test for the target fault is a=c=1.

Before proceeding further, it will be helpful to discuss the issue of detectability of a specified fault. The response of a circuit at any primary output is 0, 1, Z or U for any input vector. If the response is 0 or 1, then it is Boolean. All other responses are non-Boolean. A fault is detectable if an input vector causes the good and faulty circuits to produce different Boolean responses on at least one primary output. If such an input vector does not exist, then the fault is undetectable. Note that some faults may be detectable only by a sequence of two or more vectors. In the present case, such faults are classified as undetectable. This is because our test generation procedure does not derive multiple-vector tests. For the fault to be classified as redundant, both good and faulty circuits must produce identical Boolean and non-Boolean responses for all input vectors. Therefore, if the good circuit produces a Boolean (non-Boolean) response at a particular output for any given input vector, then the faulty circuit also produces the same Boolean (non-Boolean) response at the corresponding primary output. Note that prior methods generally identify only undetectable faults which they incorrectly label as redundant. Undetectable faults that are not redundant cannot be removed to simplify logic.

Figure 6:
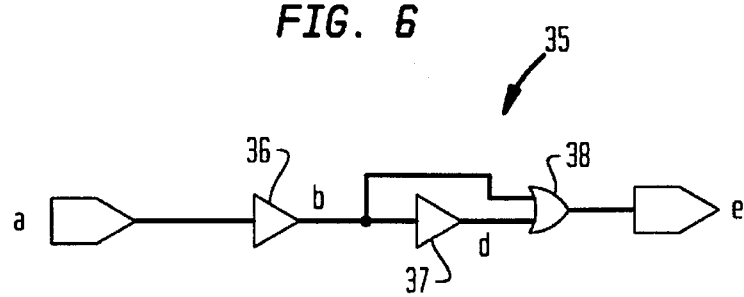
FIGS. 6, 7 and 8 are simplified versions of the circuit of FIG. 5 obtained by setting specific values to particular nodes of the circuit, and these figures will prove helpful in describing the invention.
Figure 7:
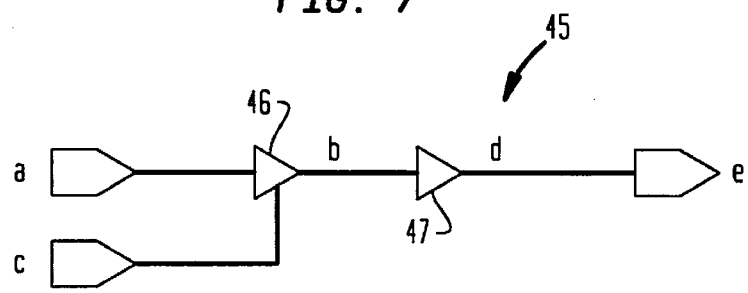
Figure 8:
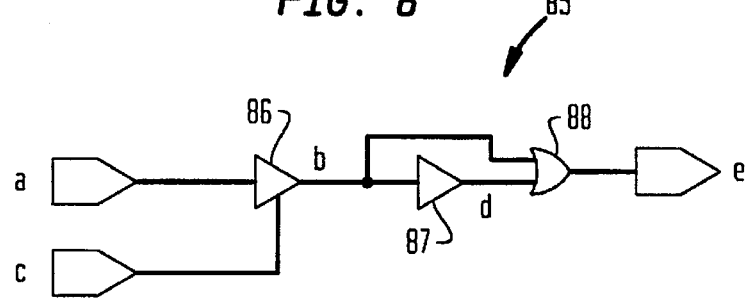

For combinational circuits, an undetectable fault is also redundant. However, for production circuits, undetectability does not imply redundancy. For example, consider again the circuit of FIG. 5. The fault c stuck at one is undetectable. This is because the good circuit response (value of signal e) is unknown (U) for all input vectors that activate the fault (or set c=0). Therefore, it is impossible to find an input vector that causes the good and faulty circuits to produce different Boolean responses. If we remove the undetectable fault by setting signal c to a 1, we obtain the circuit 35 shown in FIG. 6 because the tripbase buffer 26 and the AND gate 27 of FIG. 5 behave as non-inverting buffers 36 and 37. However, the circuits in FIGS. 5 and 6 are not functionally equivalent. This is because the two circuits respond differently to the input vector a=c=0. The response of the original circuit is U whereas the response of the modified circuit is 0. Note that a multiple-vector test can detect the fault c stuck-at 1. A possible two-vector test is as follows: the first vector is a=c=1 and the second vector is a=c=0. If we consider a stuck-at 0 fault on the branch from signal c to signal d, we can again show that this fault is undetectable. This is because signal e assumes the same value as on signal a for both good and faulty circuits. If we set the branch to the faulty value and simplify logic in known fashion, we obtain the circuit 85 of FIG. 8 consisting of tri-state buffer 86, non-inverting buffer 87 and OR circuit 88. The circuit is further simplified in FIG. 8. By considering all possible input vectors, one can easily verify that the circuits of FIGS. 5, 7 and 8 produce identical Boolean and non-Boolean responses, and that the three circuits are functionally equivalent.

The methods just discussed can be used to extend any combinational test generation algorithm for production circuits. However, a weakness of the test generation algorithms that are derived using the methodology discussed hitherto is that they cannot further classify an undetectable fault to be redundant. The test generation procedure just discussed classifies a fault as undetectable if the good and faulty circuits cannot produce a different Boolean response on at least one pair of corresponding primary outputs, for any input vector. Therefore, it is possible that there may exist input vectors that cause the good and faulty circuits to produce different Boolean and non-Boolean responses at a pair of corresponding primary outputs.

Figure 10:
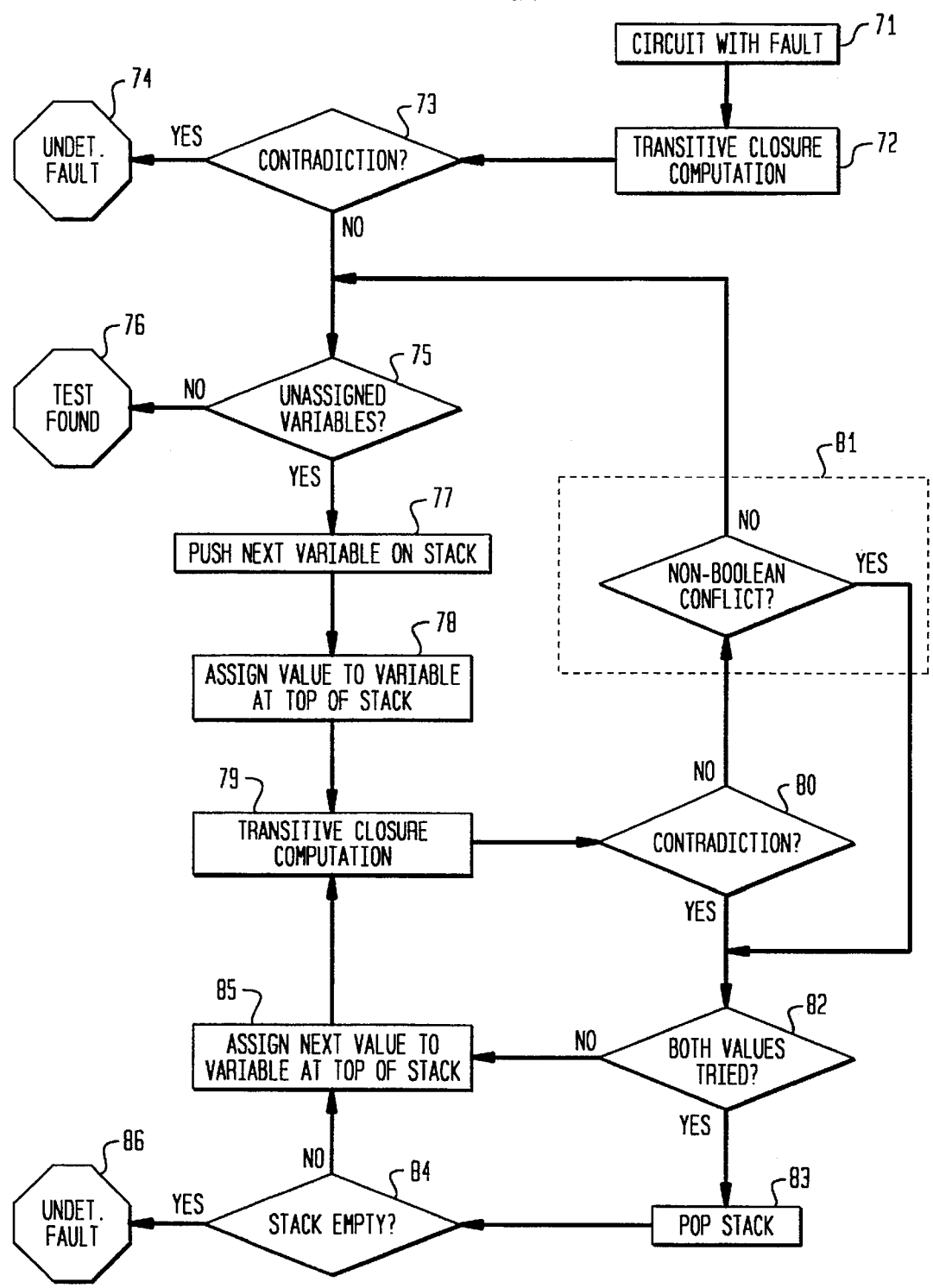
FIG. 10 is a version of the algorithm of FIG. 9 that has been relaxed in accordance with another feature of the invention for use in redundancy indentification.

FIG. 10 is the flow chart of the novel algorithm for redundancy identification to be designated as the relaxed test generation algorithm. As before, each block can represent either a computer-implemented step or a component of a special purpose computer. We begin with a circuit and a given target fault (box 71). We compute the transitive closure of the circuit (box 72) as described in the aforementioned patent. Box 73 checks if there is a contradiction. If any signal has to be assigned a value of 0 and 1 simultaneously, then a contradiction arises in box 73. In the case of a contradiction, we classify the fault as an undetectable fault (box 74).

We now enter the branch and bound phase of the test generation algorithm. During this phase, we systematically examine all combinations of values for the signals and identify a set of signal values that will serve as a test for the target fault. In box 75, we select a variable that has not yet been assigned a value. If there are no such variables, then the current assignment of logic values for the primary inputs of the circuit can serve as a test.

After selecting a variable in Box 75, we push the variable onto a stack (Box 77). This stack is used to ensure that we do not look at any combination of signal values, twice. We then assign a logic value to the variable at the top of the stack (box 78). After the value assignment, we again compute the transitive closure of the circuit using techniques described in the aforementioned patent. If the transitive closure indicates a contradiction (box 80), then we examine to see, in box 82, if we have tried both logic values 0 or 1 for the variable on the top of the stack. If there is no contradiction in box 80, then we enter box 81 to verify if the current assignment violates the non-Boolean conflict check.

If there is a non-Boolean conflict in box 81, then we check if both values on a signal have been tried (box 82). If both values have been tried, we remove the variable, for which we have considered both values, from the stack (box 83). If the stack has no variables, then the fault is undetectable (box 86) and we are done. Otherwise, we assign a new value to the variable that is now on the top of the stack. This is done in box 85.

As an example, consider again the circuit of FIG. 5. The faulty circuit corresponding to the fault c stuck-at 1 is shown in FIG. 6. The circuit of FIG. 5 produces a Boolean response for only input vectors that have c=1. For all other vectors, the response of the circuit is non-Boolean. However, the circuit of FIG. 6 is combinational and it always produces a Boolean response for any input vector. Therefore, the fault c stuck-at 1 cannot be a redundant fault.

Further analysis is required to classify an undetectable fault as redundant. The following presents such an analysis. Once a fault is identified as redundant, we can simplify the logic by assigning the faulty value to the fault site.

The main idea in identifying redundancies is to reformulate the test generation problem by ignoring the non-Boolean states of all non-Boolean components. For example, the tri-state buffer can now assume any Boolean value if its control line is assigned the value 0. Similarly, if no tri-state buffer is driving a bus, then the bus can also assume any Boolean value. Therefore, the energy functions describing the Boolean states are assumed to be a complete and accurate representation of the non-Boolean components. Since the non-Boolean states are ignored, there are fewer constraints on the values inputs and output of the component can assume. We refer to this mode of test generation as the relaxed test generation mode. The important of the relaxed mode is described by Theorem 1 which is as follows:

Theorem 1. If an undetectable fault remains undetectable in the relaxed test generation mode, then that fault is redundant.

Since the target fault is undetectable, it follows that no input vector can cause the good and faulty circuits to produce a different Boolean response on any pair of corresponding primary outputs. It suffices to show that no input vector can cause the good and faulty circuits to produce a different (Boolean or non-Boolean) response at any pair of corresponding primary outputs.

Consider any input vector. Several non-Boolean primitives in the good and faulty circuit may assume a non-Boolean value (for example, high-impedance state). In the relaxed test generation mode, every one of these primitives is considered as an independent Boolean decision variable for the given input vector. Since the fault is undetectable in the relaxed mode, it follows that no complete assignment of Boolean values to these decision variables can result in a different output response on any pair of primary outputs of the good and faulty circuits. Different input vectors may require different non-Boolean primitives to be considered as independent Boolean decision variables. Since the relaxed test generation mode implicitly considers all input vectors and all signals as possible decision variables before declaring the target fault as undetectable, therefore, the target fault is redundant. Theorem 1 forms the basis for our novel relaxed test generation algorithm for redundancy identification whose flow chart is shown in FIG. 10. We consider only energy functions that model Boolean components of non-Boolean primitives. The main differences between the production test generation algorithm shown in FIG. 9 and the relaxed test generation algorithm shown in FIG. 10 are as follows:

1. In the latter we do not perform the non-Boolean violation checks of blocks 41 and 42 or add new constraints.

2. Instead, we perform the non-Boolean conflict check indicated by block 81 of FIG. 10. We backtrack if the current partial signal assignment is such that (1) a non-Boolean primitive in the good or faulty circuit is assigned a Boolean value, (2) inputs to the non-Boolean primitive suggest a high-impedance state on the primitive in both good and faulty circuits, and (3) the primitive is assigned different Boolean values in the good and faulty circuits. These conditions ensure that for the current assignment, the non-Boolean primitive is unaffected by the fault. Hence, it should assumes the same value in good or faulty circuits.

The non-Boolean conflict 81 ensures that for a non-Boolean gate that is unaffected by the fault, we only make one Boolean decision about the value of the gate in the good and faulty circuits. Note that a non-Boolean gate can be on structural path from the fault-site to a primary output but the gate may be unaffected because of the current partial signal assignment.

As an example, consider again the circuit of FIG. 5. The stuck-at 1 fault on the fanout of signal c to gate d is undetecable. This can be easily verified by enumerating all possible input vectors to the circuit. To see if the fault is redundant, we go into the relaxed test generation mode. Signal c must be 0 in both good and fatty circuits to activate the fault. Let the first decision variable be b. Since the tri-state buffer b is clearly unaffected by the fault (there is no structural path from the fault site to a primary output that includes b), it assumes the same value in both good and faulty circuits. For this example, the non-Boolean conflict check will always fail. It is easy to see that the primary outputs of the good and faulty circuits assume identical Boolean values for both values of b. No input vector can cause the good and faulty circuit to produce different responses in the relaxed mode. Therefore, the fault is redundant.

After a fault has been established to be redundant, we can proceed to use any of the known techniques for redundancy removal. Our preferred form of removal algorithm consists of several passes of test generation.

Every pass starts with a set of vectors V and a set of faults F. For the first pass, there are no vectors and the fault list consists of M1 faults (or one member from each equivalent fault class). For subsequent passes, we delete some faults from the fault list F. This is because a circuit may be modified several times during a single pass and several signals may be eliminated during redundancy remove. A pass consists of the following steps:

1. Mark all faults in F as UNPROCESSED.

2. Perform fault simulation using vectors in set V and faults in set F. Mark faults detected by fault simulation as DETECTED. If all faults are marked DETECTED, the circuit is irredundant and we stop. No more passes are required.

3. Generate test vectors for faults marked UNPROCESSED until a redundant fault f stuck-at-v is identified. Techniques discussed earlier as Theorem 1 are used to identify redundant faults. Mark all faults detected by test generation or fault simulation as DETECTED. If there are no more faults that are marked UNPROCESSED, we terminate the current pass.

4. Remove the redundant fault by assigning the faulty value v to the fault site f, as described in a paper by P. R. Menon and H. Ahuja entitled "Redundancy Removal and Simplification of Combinational Circuits," in Proc. of VLSI Test Symp., pp 268–273, April 1992 and a paper by M. Abramovici and M. A. Iyer entitled "One-Pass Redundancy Identification and Removal," in Proc. of the Inter. Test Conf., pp. 807–815, September 1992. Delete all faults from the set F that correspond to lines removed from the circuit. Go to Step 1.

Note that because of the removal of a redundant fault, the current vector set may not detect some of the faults that were detected prior to the removal. Therefore, several passes are required to ensure that all faults in the final circuit are detectable or classified as undetectable.

TABLE 1

Results for full-scan versions of production VLSI circuits

| Circuit | Connections | | | Gates | | | Undet. faults | % Fault Eff. | CPU sec. | Vec. |
| --- | --- | --- | --- | --- | --- | --- | --- | --- | --- | --- |
| | Orig | Final | % less | Orig | Final | % less | | | | |
| p1 | 5873 | 5284 | 10.0 | 4328 | 4027 | 7.0 | 185 | 100 | 232.8 | 587 |
| p2 | 9261 | 8860 | 4.3 | 6567 | 6395 | 2.6 | 391 | 100 | 445.9 | 808 |
| p3 | 39318 | 26700 | 32.1 | 26783 | 20537 | 23.3 | 374 | 100 | 3185.4 | 705 |
| p4 | 68924 | 60199 | 12.7 | 45871 | 42289 | 7.8 | 60 | 100 | 36943.8 | 2680 |
| p5 | 63668 | 58384 | 8.3 | 41881 | 39406 | 5.9 | 42 | 100 | 31092.7 | 5012 |
| p6 | 84509 | 77994 | 7.7 | 61649 | 58139 | 5.7 | 120 | 100 | 68778.7 | 5070 |

Redundancy removal results for several production circuits are described in the above Table. These circuits have 20 to over 300 non-Boolean primitives. Size characteristics of the original circuit and the final irredundant circuit are described in columns Orig and Final, respectively. The number of connections and gates are shown in columns Connections and Gates, respectively. Column % less shows the percentage reduction in the number of connections or gates in the final circuit as compared to the original design. Column Undet. faults shows the number of undetectable faults in the final, irredundant circuit. The column Fault Eff. reports the fault efficiency achieved for the final circuit where, as used in the art, fault efficiency is the ratio of the sum of faults classified as detectable and undetectable to the total number of faults including those that could not be classified. The total time taken to generate the irredundant circuit and test vectors for all detectable faults in this circuit, is reported in column CPU sec. Column Vec. shows the number of test vectors required for the final circuit. As an example, consider circuit p3. This circuit has 39,318 connections and 26,783 gates. After redundancy removal, we obtain a circuit with 26,700 connections and 20,537 gates. The final circuit has 12,618 fewer connections. This corresponds to a $$\frac{12618}{39318} \times 100 = 32.1\%$$

reduction. Similarly, the final circuit has 23.3% fewer gates than the original design. The final circuit has 374 undetectable faults. Since all faults in the final circuit were classified as either detectable or undetectable, the fault efficiency is 100%. The experimental results are remarkable since, (1) up to 32.1% reduction in connections is possible for production circuits, and (2) there are no aborted faults for any circuit. These results demonstrate that the proposed redundancy removal method is practical for large designs.

What is claimed is:

1. A method for identifying and removing redundancies in VLSI circuits that include non-Boolean components comprising the steps of:

using a production test generation algorithm for identifying as undetectable a specific fault; and using a relaxed test generation algorithm in which specific constraints have been relaxed by ignoring the non-Boolean states of the non-Boolean components for determining whether the specified fault is still undetectable in which case the fault is considered to be redundant.

2. The method of claim 1 with the further step of redesigning the circuit to remove the redundancy.

* * * * *